(12) United States Patent
Chen et al.

(10) Patent No.: US 7,079,412 B2
(45) Date of Patent: Jul. 18, 2006

(54) PROGRAMMABLE MOS DEVICE FORMED BY STRESSING POLYCRYSTALLINE SILICON

(75) Inventors: Chung-Hui Chen, Hsin-Chu (TW); Shun-Liang Hsu, Hsin-Chu (TW); Yean-Kuen Fang, Taiwan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 53 days.

(21) Appl. No.: 10/784,705

(22) Filed: Feb. 23, 2004

(65) Prior Publication Data

US 2005/0185441 A1    Aug. 25, 2005

(51) Int. Cl.
*G11C 11/00*    (2006.01)
*G11C 7/00*     (2006.01)

(52) U.S. Cl. ............... 365/148; 365/100; 365/189.11; 365/225.7

(58) Field of Classification Search ............. 365/148, 365/189.11, 100, 225.7
See application file for complete search history.

(56) References Cited

U.S. PATENT DOCUMENTS

| | | | | |
|---|---|---|---|---|
| 4,943,538 A | * | 7/1990 | Mohsen et al. | 438/215 |
| 5,334,880 A | * | 8/1994 | Abadeer et al. | 327/526 |
| 6,208,549 B1 | | 3/2001 | Rao et al. | 365/96 |
| 6,436,738 B1 | | 8/2002 | Yu | 438/132 |
| 6,445,606 B1 | | 9/2002 | Khoury | 365/96 |
| 6,507,087 B1 | | 1/2003 | Yu | 257/529 |

OTHER PUBLICATIONS

Ker, Ming-Dou et al., "Capacitor-Couple ESD Protection Circuit for Deep-Submicron Low-Voltage CMOS ASIC", IEEE Transactions on Very Large Scale Integration (VLSI) Systems, vol. 4, No. 3, (Sep. 1996), pp. 307-321.
Ker, Ming-Dou et al., "Complementary-SCR ESD Protection Circuit with Interdigitated Finger-Type Layout for Input Pads of Submicron CMOS IC's", IEEE Transactions on Electron Devices, vol. 42, No. 7, (Jul. 1995), pp. 1297-1304.
Wu et al., A New On-Chip ESD Protection Circuit with Dual Parasitic SCR Structures for CMOS VLSI, IEEE Journal of Solid-State Circuits, vol. 27, No. 3, (Mar. 1992), pp. 274-280.

* cited by examiner

*Primary Examiner*—Son T. Dinh
(74) *Attorney, Agent, or Firm*—Duane Morris LLP

(57) ABSTRACT

A programmable memory circuit and a method for programming the same are disclosed. A polycrystalline silicon resistor pair are used in a programmable memory cell. The pair includes a first polycrystalline silicon resistor stressable by a predetermined current thereacross, and a second polycrystalline silicon resistor similarly structured as the first polycrystalline silicon resistor stressable by the predetermined current, wherein when only the first resistor is stressed by the predetermined current, a resistance of the first resistor is lowered as compared to the unstressed second resistor, thereby programming the memory cell.

25 Claims, 3 Drawing Sheets

PROGRAMMABLE MOS DEVICE FORMED BY STRESSING POLYCRYSTALLINE SILICON

BACKGROUND OF THE DISCLOSURE

The present invention relates generally to the field of semiconductor devices, and more particularly to memory devices. Still more particularly, the invention relates to methods for programming semiconductor memory devices by stressing polycrystalline silicon resistors.

Polycrystalline silicon is used for various purposes in semiconductor devices. For example, it is commonly used as a conductive material such as gate electrodes in metal oxide semiconductor (MOS) transistors. It may be used as a diffusion source on a semiconductor body, or as a resistive material. The electric conductivity of polycrystalline silicon may be influenced by a variety of factors, including but not limiting to: the choice of dopant, dopant density, polycrystalline grain size, polycrystalline geometries, and stress time.

Dopants are elements introduced to semiconductor to establish conductivity. Common N-type dopants in silicon include phosphorous (P), arsenic (As) and antimony (Sb). As an example, carbon is also a known dopant in polycrystalline silicon. When there is a low level of carbon, electric resistance and activation energy of the polycrystalline silicon decrease when carbon concentration increases. The decrease in resistance and activation energy is due to the presence of carbon atoms at the boundaries of silicon crystallites, which increases the mobility of charge carriers over the grain limits. When carbon concentration in polycrystalline silicon is further increased, both the resistance and activation energy of the resistance increase. This is attributable to the presence of silicon carbide and/or carbon beside the polycrystalline silicon. When carbon concentration is further increased, both resistance and activation energy of resistance decrease. The comparative low levels of resistance and activation energy are attributable to conductivity via carbon bridges.

Typically, polycrystalline silicon resistors are formed in a dielectric layer overlying the silicon substrate. The initial conductivity of the polycrystalline silicon resistor is determined chiefly by both the concentration of and the homogeneity of distribution of the implanted dopants in the polycrystalline material. As an example, phosphorous (stable isotope: P-31) is used as dopant. The phosphorous-doped polycrystalline silicon can be prepared by implanting P-31 ions into an oxidized silicon substrate. Depending on the concentration of P-31 ions, and how they are distributed, the conductivity of the polycrystalline silicon resistor may vary significantly. For example, if there are not enough P-31 ions, conductivity will remain low across the polycrystalline silicon resistor. Even if there are enough P-31 ions, but if they are not distributed uniformly over the geometry of the polycrystalline silicon resistor, conductivity will still remain low.

Polycrystalline silicon is made up of grains or crystallites of silicon. The properties of these grains, including grain size, inter-grain distances and grain density, can materially affect the conductivity of the polycrystalline silicon resistor. The geometry of the polycrystalline silicon resistor also affects its conductivity. Generally, the geometry is chosen to avoid complications of edge effects inherent at minimum geometries and to provide stress characteristics dominated by the film properties alone.

When the polycrystalline silicon resistor is stressed, various factors can influence subsequent conductivity. First, defects in the grain boundary of the polycrystalline silicon resistor trap electrons, thereby reducing the average mobility of these electrons. As the stressing current increases, more electrons can have enough energy to escape the electron trap, thereby increasing conductivity. Second, stressing current generates heat energy, which raises temperature of the polycrystalline silicon resistor. The generated heat energy assists implanted ions to segregate from grain region into grain boundary, thereby filling the defects within the grain boundary and increasing conductivity. Finally, the increase in heat energy leads to lattice vibration and electron collision, both of which decrease conductivity.

As stressing current increases, conductivity increases due to electrons escaping grain traps and ions segregating from grain region into grain boundary. As stressing current further increases, conductivity decreases due to the increases in lattice vibration and electron collision. However, the increase in conductivity due to escaping electrons and segregating ions overweighs the decrease in conductivity due to lattice vibration and electron collision. As stressing current further increases, grain boundary melting occurs, thereby further increasing conductivity. Although ion segregation can be reversed, i.e. dopant atoms diffuse from the grain boundaries back to the grain region, it can only be achieved through Joule heating. Therefore, without Joule heating, it is difficult to reverse ion segregation. As such, conductivity of the polycrystalline silicon resistor will be permanently increased. In other words, the resistivity of the polycrystalline silicon resistor will be permanently decreased.

Through controlled ion segregation, it is therefore possible to precisely control the final resistor value. Compensation techniques, such as Joule heating or further current stressing can be used to fine-tune a resistor's resistivity. In other words, the polycrystalline silicon resistor can be programmed by stressing it with a stressing current. Used in a memory circuit, the permanent change to the resistivity of the polycrystalline silicon resistor in effect "stores" a specific memory state. A plurality of polycrystalline silicon resistors allow one to act as the programmed state while the other as the reference state. A comparison of the two resistor values therefore yields valuable memory information.

Desirable in the art of semiconductor memory design are additional methods and materials through which one-time programming of non-volatile data can be achieved.

SUMMARY OF THE DISCLOSURE

In view of the foregoing, this disclosure provides a programmable memory circuit and the method for programming the same.

In one example, a polycrystalline silicon resistor pair are used in a programmable memory cell. The pair includes a first polycrystalline silicon resistor stressable by a predetermined current thereacross, and a second polycrystalline silicon resistor similarly structured as the first polycrystalline silicon resistor stressable by the predetermined current, wherein when only the first resistor is stressed by the predetermined current, a resistance of the first resistor is lowered as compared to the unstressed second resistor, thereby programming the memory cell.

In one example, the circuit comprises a data read module having a first output and a second output based on a voltage difference between a first input and a second input, a first polycrystalline resistor having a first end connectable to a first control voltage level, and a second end connected to a second control voltage level, a second polycrystalline resistor having a first end connectable to a first control voltage level, and a second end connected to a second control voltage level, and a connection module for connecting the first ends of the first and second resistors to the first and second inputs respectively. When the first and second control voltage levels are imposed, either the first or second resistor is programmed by causing a current stress across the resistor. The first and second outputs of the data read module produce voltage results representing the programmed value of the first or second resistor when the connection module is enabled.

DETAILED DESCRIPTION

Figure 1:
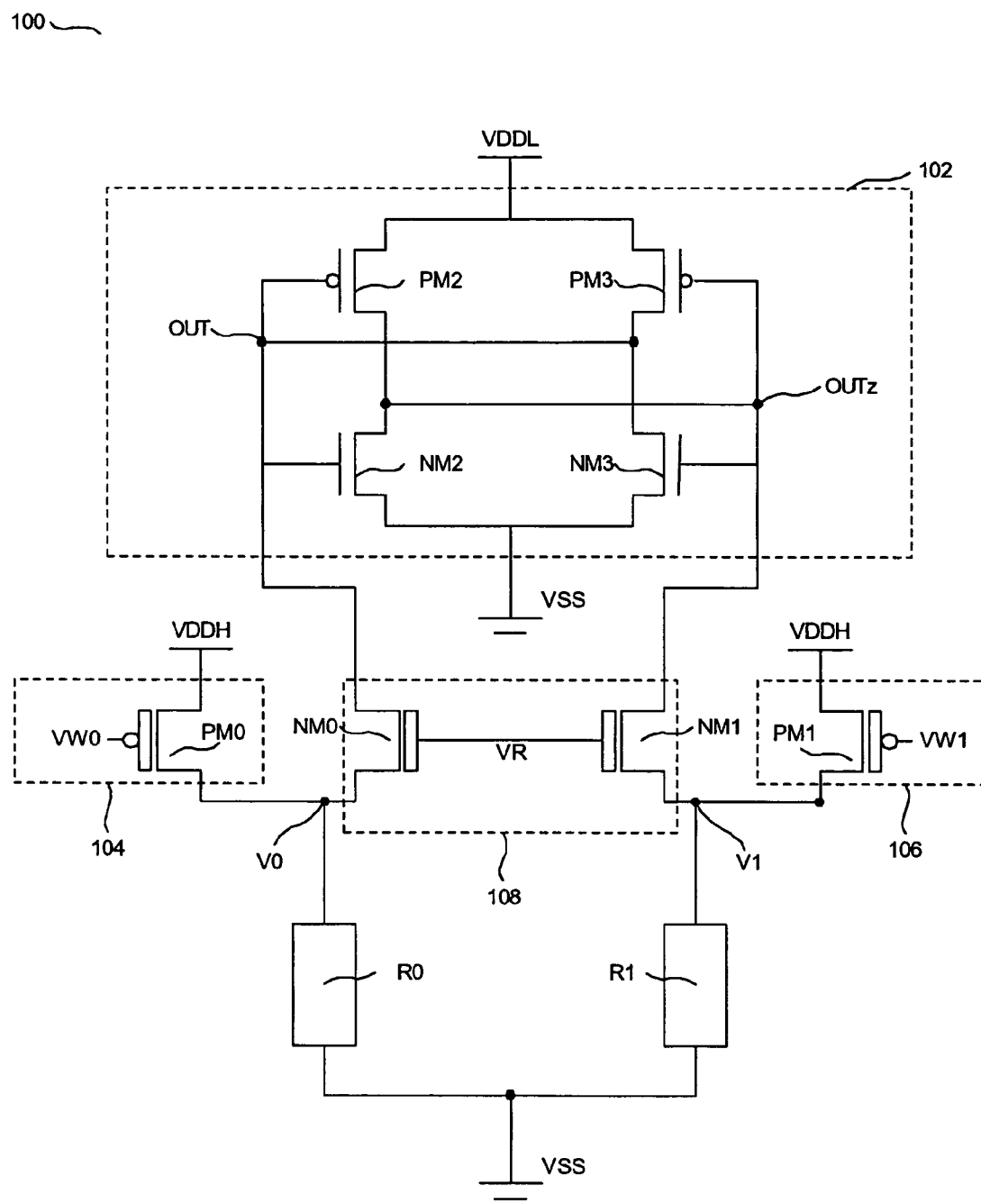
FIG. 1 illustrates the memory device in accordance with one example of the present disclosure.

In the present disclosure, a memory device using a stressing current to program two polycrystalline resistors (poly-Rs) is disclosed. FIG. 1 shows a memory device 100 that can be programmed by causing a current stress across poly-Rs. The device includes a data read module 102 such as a latch, two programming trigger modules 104 and 106, a connection module 108, and two poly-Rs R0 and R1, into which the memory datum is programmed. Prior to programming, R0 and R1 must be identical in resistance.

The programming trigger modules 104 and 106 perform write operations, while the connection module 108 triggers a read operation. The programming trigger modules may include thick gate oxide P-type devices PM0 and PM1, respectively, while the connection module 108 may include two thick gate oxide N-type devices NM0 and NM1. However, it is understood by those skilled in the art that the programming trigger modules 104 and 106, and the connection module 108 may include other circuit elements that provide similar gating functionalities. The data read module 102 may include four transistors, two P-type devices PM2 and PM3, and two N-type devices NM2 and NM3. However, it is also understood by those skilled in the art that the data read module 102 may include other circuit elements that provide a voltage comparison function.

Thick gate devices are used in this memory device because a plurality of devices contained therein must withstand a voltage, which is typically higher than operating voltage, necessary to successfully cause current stress across R0 and R1.

The drains of PM0 and PM1 are connected to a high operating voltage VDDH, which is typically higher than a regular operating voltage, for the reason previously described. For example, VDDH is 3.3V and the threshold voltage to achieve hot carrier effect is 1.2V, while regular operating voltage is less than 1V. The sources of PM0 and PM1 are connected to R0 and R1, respectively, and further connected to the sources of NM0 and NM1, respectively. For illustration purposes, control voltage levels/references at the sources of PM0 and PM1 are referred to as V0 and V1, respectively. The two nodes VW0 and VW1 represent the voltage levels at the gates of PM0 and PM1, respectively, for programming the memory device.

R0 and R1 are connected to a control voltage level such as VSS which, depending on circuit setup, may or may not be directly connected to ground. The gates of NM0 and NM1 are connected together, through a voltage reference VR. The drain of NM0 connects to the gates of PM2 and NM2, while the drain of NM1 connects to the gates of PM3 and NM3. The connection module 108, which includes NM0 and NM1, passes V0 and V1 as two inputs to the data read module 102 when R is set at an appropriate level. The drains of PM2 and PM3 are connected to an operating voltage VDDL, while the sources of PM2 and PM3 are connected to the drains of NM2 and NM3, respectively. The sources of NM2 and NM3 are connected to VSS. The gates of PM2 and NM2 are connected to the source of PM3 and the drain of NM3, whereupon this connection has an output voltage potential OUT. The gates of PM3 and NM2 are connected to the source of PM2 and the drain of NM2, whereupon this connection has an output voltage potential OUTz.

Figure 2A:
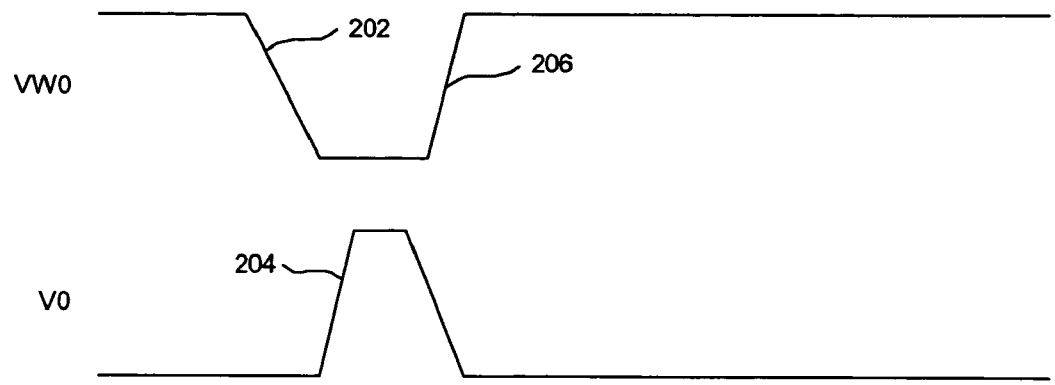
FIG. 2A illustrates a timing diagram showing the voltage at two nodes during a write operation in accordance with a first example of the present disclosure.

For illustration purposes, in a first example, the memory device will be programmed with a "0". FIG. 2A illustrates a timing diagram showing the voltage at various nodes in FIG. 1 during an operation to program the memory device with a "0". With reference to both FIGS. 1 and 2A, both VW0 and VW1 are at VDDH upon power-up, while VR is close to VSS. When a write operation occurs, VW0 is temporarily switched to 0 from VDDH, thereby allowing PM0 to conduct, while VW1 stays at VDDH. The switch at VW0 is represented by a falling edge 202. V0 is then built up to VDDH, as represented by a rising edge 204. The large voltage difference between V0 and VSS results in a large current along R0, thereby stressing R0. When R0 is stressed enough to cause implanted ions to permanently segregate from grain region into grain boundary, thereby permanently decreasing the resistance of R0, R0 is considered "programmed". When VW0 is switched back to VDDH, as represented by a rising edge 206, PM0 ceases to conduct. Conversely, since VW1 remains at VDDH, PM1 does not conduct and R1 is never stressed.

Figure 2B:
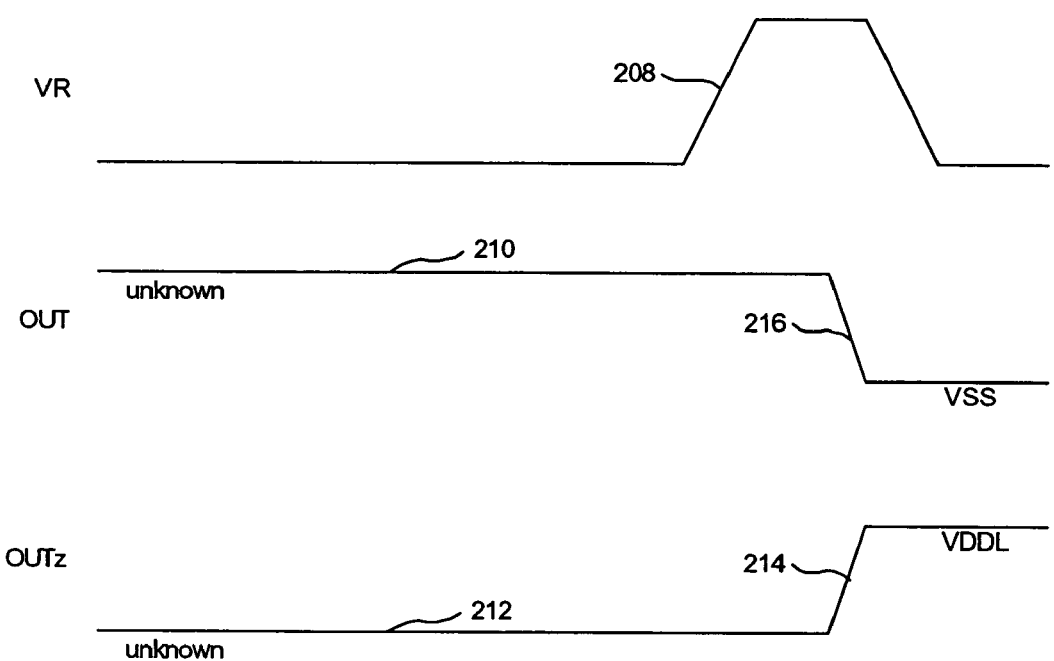
FIG. 2B illustrates a timing diagram showing the voltage at various nodes during a read operation in accordance with the first example of the present disclosure.

FIG. 2B illustrates a timing diagram showing the voltage at various nodes in FIG. 1 during a read operation. With reference to both FIGS. 1 and 2B, when a read operation occurs, VR rises, which is represented by a rising edge 208. It is noted that before a reading operation occurs, both voltage potentials at OUT and OUTz are still indeterminate, as represented by 210 and 212. When VR rises enough, NM0 and NM1 conduct, thereby sending V0 and V1 to OUT and OUTz, respectively. Since R0 is smaller than R1, V0 is lower than V1. Subsequently, the voltage potential at OUT is lower than the voltage potential at OUTz. The latch 102 further forces OUTz to move to as high a voltage as VDDL, as represented by a rising edge 214, while OUT moves to VSS, as represented by a falling edge 216. The data of the memory device can be obtained by reading OUT, which essentially carries the "0" that is originally programmed into R0. Based on the function of the data read module 102 in this configuration, it can be viewed as a comparison circuit which compares V0 and V1, and produces an output on OUT node accordingly.

When VR signal is turned off (i.e. switch to VSS), NM0 and NM1 no longer conduct, thereby disconnecting OUT from V0 and OUTz from V1. At this point, however, the latch 102 will force OUT to move to VDDL if it is higher than OUTz. Conversely, the latch 102 will force OUT to move to VSS if it is lower than OUTz. In this example, since the voltage potential at OUT is lower than the voltage potential at OUTz just prior to when VR switches to VSS, OUTz either stays at or move to VDDL while OUT either stays at or move to VSS.

Since the latch 102 will always move OUT away from OUTz after a read operation, OUTz is essentially a negation of OUT after a read operation. It is also noted that before a read operation, the states of OUT and OUTz are indeterminate. Since the latch 102 will also hold the information of the memory device at OUT after a read operation is completed, the latch 102 in effect is a memory cell that either holds a "1" or "0" at OUT.

Figure 3A:
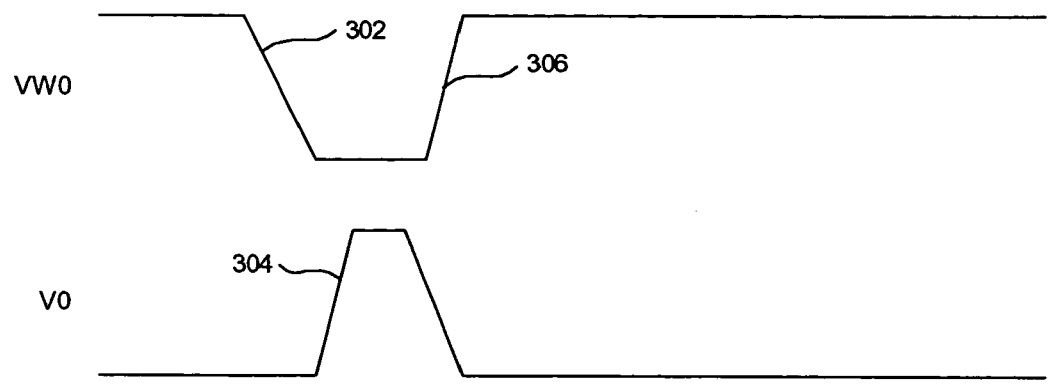
FIG. 3A illustrates a timing diagram showing the voltage at two nodes during a write operation in accordance with a second example of the present disclosure.

In a second example, the memory device will be programmed with a "1". FIG. 3A illustrates a timing diagram showing the voltage at various nodes in FIG. 1 during an operation to program the memory device with a "1". With reference to both FIGS. 1 and 3A, both VW0 and VW1 are at VDDH upon power-up, while VR is close to VSS. When a write operation occurs, VW1 is temporarily switched to 0 from VDDH, thereby allowing PM1 to conduct, while VW0 stays at VDDH. The switch at VW1 is represented by a falling edge 302. V1 is then built up to VDDH, as represented by a rising edge 304. The large voltage difference between V1 and VSS results in a large current along R1, thereby stressing R1. When R1 is stressed enough to cause implanted ions to permanently segregate from grain region into grain boundary, thereby permanently decreasing the resistance of R1, R1 is considered "programmed". When VW1 is switched back to VDDH, as represented by a rising edge 306, PM1 ceases to conduct. Conversely, since VW0 remains at VDDH, PM0 does not conduct and R0 is never stressed.

Figure 3B:
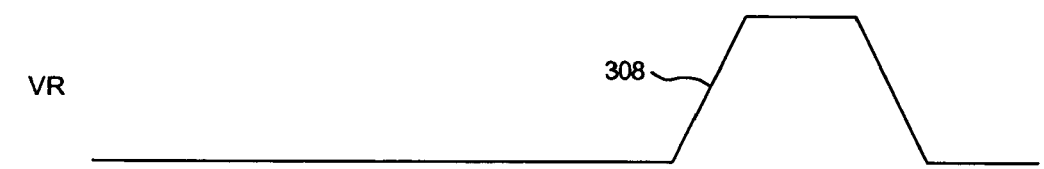
FIG. 3B illustrates a timing diagram showing the voltage at various nodes during a read operation in accordance with the second example of the present disclosure.
Figure 3B:
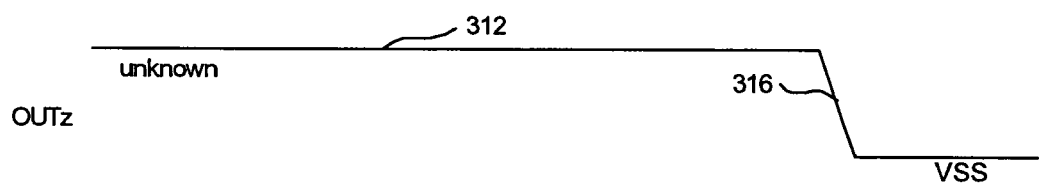
Figure 3B:
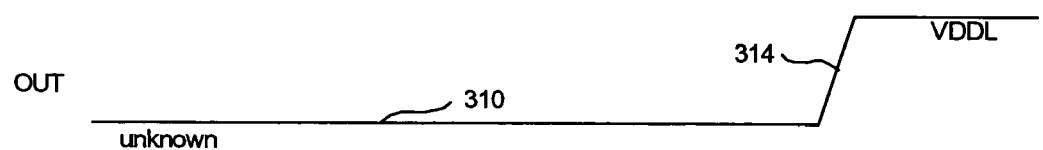

FIG. 3B illustrates a timing diagram showing the voltage at various nodes in FIG. 1 during a read operation. With reference to both FIGS. 1 and 3B, when a read operation occurs, VR rises, which is represented by a rising edge 308. It is noted that before a reading operation occurs, both voltage potentials at OUT and OUTz are still indeterminate, as represented by 310 and 312. When VR rises enough, NM0 and NM1 conduct, thereby sending V0 and V1 to OUT and OUTz, respectively. Since R1 is smaller than R0, V1 is lower than V0. Subsequently, the voltage potential at OUTz is lower than the voltage potential at OUT. The latch 102 further forces OUT to move to as high a voltage as VDDL, as represented by a rising edge 314, while OUTz moves to VSS, as represented by a falling edge 316. The data of the memory device can be obtained by reading OUT, which essentially carries the "1" that is originally programmed into R1.

When VR signal is turned off (i.e. switch to VSS), NM0 and NM1 no longer conduct, thereby disconnecting OUT from V0 and OUTz from V1. Since the voltage potential at OUTz is lower than the voltage potential at OUT just prior to when VR switches to VSS, OUT either stays at or move to VDDL while OUTz either stays at or move to VSS.

Since the latch 102 will always move OUT away from OUTz after a read operation, OUTz is essentially a negation of OUT after a read operation. It is also noted that before a read operation, the states of OUT and OUTz are indeterminate. Since the latch 102 will also hold the information of the memory device at OUT after a read operation is completed, the latch 102 in effect is a memory cell that either holds a "1" or "0" at OUT.

The above disclosure provides many different embodiments, or examples, for implementing different features of the disclosure. Specific examples of components, and processes are described to help clarify the disclosure. These are, of course, merely examples and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the disclosure, as set forth in the following claims.

What is claimed is:

1. A programmable metal-oxide-semiconductor (MOS) memory circuit comprising:
   a data read module having a first output and a second output based on a voltage difference between a first input and a second input;
   a first polycrystalline resistor having a first end connectable to a first control voltage level, and a second end connected to a second control voltage level;
   a second polycrystalline resistor having a first end connectable to a first control voltage level, and a second end connected to a second control voltage level; and
   a connection module for connecting the first ends of the first and second resistors to the first and second inputs respectively,
   wherein the first and second control voltage levels are imposed to program either the first or second resistor by causing a current stress across the resistor, and
   wherein the first and second outputs of the data read module produce voltage results representing the programmed value of the first or second resistor when the connection module is enabled.

2. The circuit of claim 1 wherein the first voltage level is imposable through a P-type MOS transistor to the first end of the first or second resistor.

3. The circuit of claim 2 wherein the P-type MOS transistor is a thick oxide MOS transistor.

4. The circuit of claim 1 wherein the first control voltage level is higher than the operating voltage.

5. The circuit of claim 1 wherein the second control voltage level is at a ground level.

6. The circuit of claim 1 wherein the voltage result represents either a logical one (1) or a logical zero (0).

7. The circuit of claim 1 wherein the first and second outputs of the data read module are complementary to each other.

8. The circuit of claim 1 wherein the connection module has two N-type devices with their gates connected together to a third control voltage level.

9. The circuit of claim 8 wherein the N-type devices are thick oxide MOS devices.

10. A method for programming a metal-oxide-semiconductor (MOS) memory circuit, the circuit comprising a data read module having a first input and a second input and one or more outputs, a first and second polycrystalline resistors having their first ends connectable to a first control voltage level and their second end connected to a second voltage level, and a connection module for connecting the first ends of the first and second resistors to the first and second inputs respectively, the method comprising:

disenabling the connection module for disconnecting the first ends of the resistors from the first and second inputs;

imposing the first control voltage on the first end of the first or second resistor; and relieving the first control voltage from the connected first end of either the first or second resistor.

11. The method of claim 10 further comprising obtaining one or more voltage results from the outputs of the data read module representing whether the first or second resistor has been programmed.

12. The method of claim 11 wherein the obtaining farther includes:

enabling the connection module for connecting the first end of the first resistor to the first input, and the first end of the second resistor to the second input; and generating a first voltage result representing that the first or second resistor has been programmed by comparing the voltage difference between the first input and the second input.

13. The method of claim 10 wherein the first control voltage level is imposable through a P-type MOS transistor to cause the current stress across the first or second resistor.

14. The method of claim 10 wherein the first voltage level is higher than an operating voltage of the data read module.

15. The method of claim 10 wherein the second voltage level is at a ground level.

16. A programmable metal-oxide-semiconductor (MOS) memory circuit comprising:

a first polycrystalline resistor having a first end connectable to a first control voltage level, and a second end connectable to a second voltage level; and a second polycrystalline resistor having a first end connectable to the first control voltage level, and a second end connectable to the second voltage level.

wherein the first and second control voltage levels are imposed to program either the first or second resistor by causing a current stress across the resistor that causes hot carrier effects for programming the memory circuit.

17. The circuit of claim 16 wherein the first control voltage level is 3.3V.

18. The circuit of claim 16 wherein a threshold voltage to achieve hot carrier effects in the first and second resistors is 1.2V.

19. The circuit of claim 16 further comprising:

a latch module having a first output and a second output based on a voltage difference between a first input and a second input, wherein the first and second inputs are connectable to first ends of the first and second resistors to generate the first and second outputs of the latch representing a programmed value of the first or second resistor.

20. The circuit of claim 19 further comprising a connection module having two N-type transistors with their gates connected together to a third control voltage for connecting the first end of the lint resistor to the first input of the latch, and the first end of the second resistor to the second input of the latch.

21. The circuit of claim 16 further comprising a programming triggering module connecting the first voltage level to the first end of the first or second resistor.

22. The circuit of claim 21 wherein the programming triggering module is a P-type MOS device.

23. A polycrystalline silicon resistor pair used in a programmable memory cell comprising:

a first polycrystalline silicon resistor stressable by a predetermined current thereacross;

a second polycrystalline silicon resistor similarly structured as the first polycrystalline silicon resistor stressable by the predetermined current; and means for reading the programmed memory cell, including a first output and a second output based on a voltage difference between a first input and a second input wherein the first and second inputs are connectable to first ends of the first and second resistors to generate the first and second outputs of the latch representing a programmed value of the memory cell, wherein when only the first resistor is stressed by the predetermined current, a resistance of the first resistor is lowered as compared to the unstressed second resistor, thereby programming the memory cell.

24. The memory cell of claim 23 further comprising means for imposing the predetermined current across the first resistor.

25. The memory cell of claim 23 wherein the first and second resistors do not have salicide metal associated therewith.

* * * * *

UNITED STATES PATENT AND TRADEMARK OFFICE
CERTIFICATE OF CORRECTION

| | | |
|---|---|---|
| PATENT NO. | : 7,079,412 B2 | Page 1 of 1 |
| APPLICATION NO. | : 10/784705 | |
| DATED | : July 16, 2006 | |
| INVENTOR(S) | : Chung-Hui Chen, Shun-Liang Hsu and Yean-Kuen Fang | |

It is certified that error appears in the above-identified patent and that said Letters Patent is hereby corrected as shown below:

Column 7, line 12, delete "farther" and insert therefore -- further --.

Column 8, line 12, delete "lint" and insert therefore -- first --.

Signed and Sealed this

Twenty-fourth Day of July, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,079,412 B2 | Page 1 of 1 |
| APPLICATION NO. | : 10/784705 | |
| DATED | : July 18, 2006 | |
| INVENTOR(S) | : Chung-Hui Chen, Shun-Liang Hsu and Yean-Kuen Fang | |

It is certified that error appears in the above-identified patent and that said Letters Patent is hereby corrected as shown below:

Column 7, line 12, delete "farther" and insert therefore -- further --.

Column 8, line 12, delete "lint" and insert therefore -- first --.

This certificate supersedes Certificate of Correction issued July 24, 2007.

Signed and Sealed this

Fourteenth Day of August, 2007

JON W. DUDAS
*Director of the United States Patent and Trademark Office*